United States Patent
Mariani et al.

(10) Patent No.: US 9,209,187 B1
(45) Date of Patent: Dec. 8, 2015

(54) METHODS OF FORMING AN ARRAY OF GATED DEVICES

(71) Applicant: Micron Technology, Inc., Boise, ID (US)

(72) Inventors: Marcello Mariani, Milan (IT); Alessandro Grossi, Milan (IT); Federica Zanderigo, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/461,689

(22) Filed: Aug. 18, 2014

(51) Int. Cl.
| | |
|---|---|
| H01L 29/74 | (2006.01) |
| H01L 27/105 | (2006.01) |
| H01L 21/8222 | (2006.01) |
| H01L 27/102 | (2006.01) |
| H01L 21/768 | (2006.01) |
| H01L 21/8234 | (2006.01) |
| H01L 29/66 | (2006.01) |
| H01L 21/762 | (2006.01) |
| H01L 21/306 | (2006.01) |
| G03F 7/20 | (2006.01) |
| H01L 29/423 | (2006.01) |

(52) U.S. Cl.
CPC ............. *H01L 27/105* (2013.01); *G03F 7/20* (2013.01); *H01L 21/30604* (2013.01); *H01L 21/768* (2013.01); *H01L 21/76224* (2013.01); *H01L 21/8222* (2013.01); *H01L 21/823412* (2013.01); *H01L 21/823475* (2013.01); *H01L 21/823487* (2013.01); *H01L 27/1022* (2013.01); *H01L 27/1027* (2013.01); *H01L 29/4236* (2013.01); *H01L 29/6656* (2013.01); *H01L 29/66363* (2013.01)

(58) Field of Classification Search
None
See application file for complete search history.

(56) References Cited

U.S. PATENT DOCUMENTS

| | | | |
|---|---|---|---|
| 3,988,771 | A | 10/1976 | Krishna |
| 5,412,598 | A | 5/1995 | Shulman |
| 5,465,249 | A | 11/1995 | Cooper, Jr. et al. |
| 5,510,630 | A | 4/1996 | Agarwal et al. |
| 5,874,760 | A | 2/1999 | Burns, Jr. et al. |
| 5,930,640 | A | 7/1999 | Kenney |

(Continued)

FOREIGN PATENT DOCUMENTS

| | | |
|---|---|---|
| JP | 2003-030980 | 1/2003 |
| KR | 10-2010-0070835 | 6/2010 |

(Continued)

OTHER PUBLICATIONS

U.S. Appl. No. 14/265,168, filed Apr. 29, 2014, Righetti et al.

(Continued)

*Primary Examiner* — Angel Roman
(74) *Attorney, Agent, or Firm* — Wells St. John, P.S.

(57) ABSTRACT

A method of forming an array of gated devices includes forming a plurality of semiconductor material-comprising blocks individually projecting elevationally from a substrate and spaced from one another along rows and columns. A gate line is formed laterally proximate each of two opposing sidewalls of the blocks along individual rows of the blocks. After forming the gate lines, semiconductor material of the blocks is removed laterally between the gate lines to form pairs of pillars from the individual blocks that individually have one of the gate lines laterally proximate one of two laterally outermost sidewalls of the pair and another of the gate lines laterally proximate the other of the two laterally outermost sidewalls of the pair. Other methods are disclosed.

25 Claims, 9 Drawing Sheets

(56) References Cited

U.S. PATENT DOCUMENTS

| | | | |
|---|---|---|---|
| 6,017,778 | A | 1/2000 | Pezzani |
| 6,576,944 | B2 | 6/2003 | Weis |
| 6,627,924 | B2 | 9/2003 | Hsu et al. |
| 6,653,174 | B1 | 11/2003 | Nemati et al. |
| 6,690,039 | B1 | 2/2004 | Nemati et al. |
| 6,713,791 | B2 | 3/2004 | Hsu et al. |
| 6,870,202 | B2 | 3/2005 | Oka |
| 6,891,205 | B1 | 5/2005 | Cho et al. |
| 6,914,286 | B2 | 7/2005 | Park |
| 6,934,209 | B2 | 8/2005 | Marr |
| 6,958,513 | B2 | 10/2005 | Wang |
| 6,965,129 | B1 | 11/2005 | Horch et al. |
| 7,015,092 | B2 | 3/2006 | Jaiprakash et al. |
| 7,029,956 | B2 | 4/2006 | Hsu et al. |
| 7,081,663 | B2 | 7/2006 | Bulucea |
| 7,151,024 | B1 | 12/2006 | Forbes |
| 7,195,959 | B1 | 3/2007 | Plummer et al. |
| 7,304,327 | B1 | 12/2007 | Nemati et al. |
| 7,326,969 | B1 | 2/2008 | Horch |
| 7,362,609 | B2 | 4/2008 | Harrison et al. |
| 7,378,325 | B2 | 5/2008 | Kaneko et al. |
| 7,440,310 | B2 | 10/2008 | Bhattacharyya |
| 7,456,439 | B1* | 11/2008 | Horch ............... 257/133 |
| 7,488,627 | B1 | 2/2009 | Nemati et al. |
| 7,786,505 | B1 | 8/2010 | Yang et al. |
| 7,816,728 | B2 | 10/2010 | Ho et al. |
| 7,897,440 | B1 | 3/2011 | Horch |
| 8,102,025 | B2 | 1/2012 | Ozeki et al. |
| 8,288,795 | B2* | 10/2012 | Tang ............... 257/107 |
| 8,435,859 | B2 | 5/2013 | Housley |
| 8,518,812 | B2 | 8/2013 | Mariani et al. |
| 8,519,431 | B2 | 8/2013 | Nemati et al. |
| 8,598,621 | B2* | 12/2013 | Tang ............... 257/135 |
| 2002/0094619 | A1 | 7/2002 | Mandelman et al. |
| 2002/0158254 | A1 | 10/2002 | Hsu et al. |
| 2004/0159853 | A1 | 8/2004 | Nemati et al. |
| 2008/0003774 | A1 | 1/2008 | Baek |
| 2009/0140290 | A1 | 6/2009 | Schulze et al. |
| 2009/0189228 | A1 | 7/2009 | Zhang et al. |
| 2010/0197141 | A1 | 8/2010 | Tu et al. |
| 2011/0024791 | A1 | 2/2011 | Schulze et al. |
| 2011/0223731 | A1 | 9/2011 | Chung et al. |
| 2012/0205736 | A1 | 8/2012 | Housley |
| 2012/0223369 | A1 | 9/2012 | Gupta et al. |
| 2012/0228629 | A1 | 9/2012 | Nemati et al. |
| 2014/0106554 | A1 | 4/2014 | Pozzi et al. |

FOREIGN PATENT DOCUMENTS

| | | |
|---|---|---|
| WO | PCT/US2012/021438 | 8/2012 |
| WO | PCT/US2012/025109 | 9/2012 |
| WO | PCT/US2012/021438 | 8/2013 |
| WO | PCT/US2012/025109 | 9/2013 |

OTHER PUBLICATIONS

U.S. Appl. No. 14/461,751, filed Aug. 18, 2014, Mariani et al.
U.S. Appl. No. 14/461,730, filed Aug. 18, 2014, Zanderigo et al.
Burke et al., "Silicon Carbide Thyristors for Power Applications", Pulsed Power Conference 1995, Digest of Technical Papers, 10th IEEE International vol. 1, United States, pp. 327-335.
Cheong et al., "Investigation of Ultralow Leakage in MOS Capacitors on 4H SiC", IEEE Transactions on Electron Devices, vol. 51(9), Sep. 2004, pp. 1361-1365.
Cho et al., A Novel Capacitor-Less DRAM Cell Using Thin Capacitively-Couples Thyristor (TCCT), IEEE, 2005, 4 pages.
Dimitraiadis et al., "New a-SiC, Optically Controlled, Thyristor-Like Switch", Electronics Letters, vol. 28)17), Aug. 13, 1992, pp. 1622-1624.
Jen et al., "Electrical and Luminescent Characteristics of a-SiC:H P-I-:" Thin-Film LED's with Graded-Gap Junctions", IEEE Transactions on Electron Devices, vol. 44(4), Apr. 1997, pp. 565-571.
Nemati et al., A Novel High Density, Low Voltage SRAM Cell with a Vertical DR Device, IEEE, 1998, 2 pages.
Powell et al., "SiC Materials—Progree, Status, and Potential Roadblocks", Proceedings of the IEEE, vol. 90(6), Jun. 2002, pp. 942-955.
Sasage et al., "Cross-point phase chance memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Tzeng et al., "Dry Etching of Sllicon Materials in SF6 Based Plasmas", J. Electrochem. Soc., 1987 vol. 134, issue 9, pp. 2304-2309.
Xie et al., "A Vertically Integrated Bipolar Storage Cell in 6H Silicon Carbide for Nonvolatile Memory Applications", IEEE Electron Device Letters, vol. 15(6), Jun. 1994, pp. 212-214.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Socirty, vol. 154, No. 1, 2007, pp. H20-H25.

\* cited by examiner

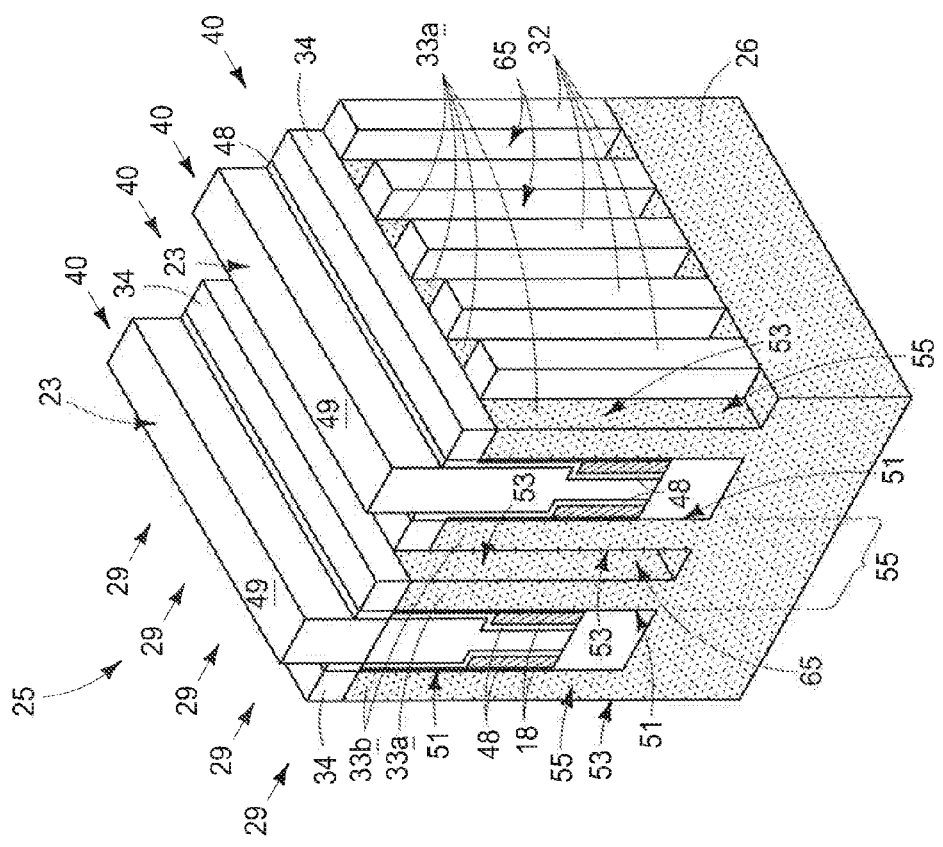
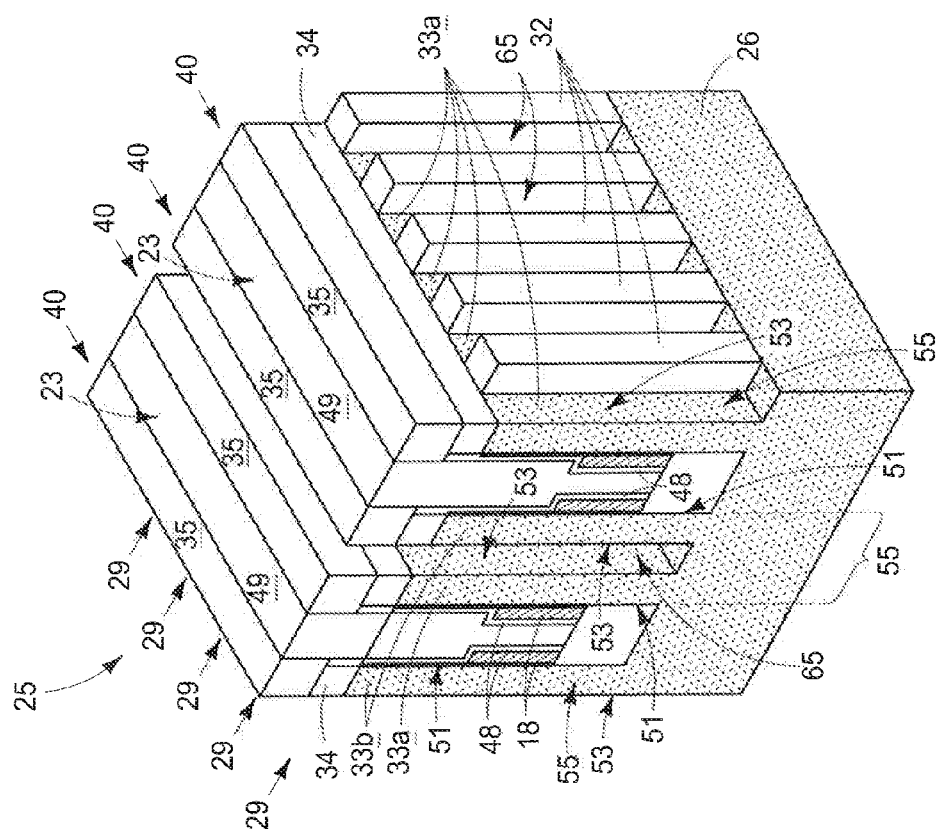

METHODS OF FORMING AN ARRAY OF GATED DEVICES

TECHNICAL FIELD

Embodiments disclosed herein pertain to methods of forming arrays of gated devices.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The data/sense lines may conductively interconnect memory cells along columns of the array, and the access lines may conductively interconnect memory cells along rows of the array. Each memory cell may be uniquely addressed through the combination of a data/sense line and an access line.

Memory cells may be volatile, semi-volatile, or non-volatile. Non-volatile memory cells can store data for extended periods of time in the absence of power. Nonvolatile memory is conventionally specified to be memory having a retention time of at least about 10 years. Volatile memory dissipates and therefore requires being refreshed/rewritten to maintain data storage. Volatile memory may have a retention time of milliseconds, or less. The memory cells are configured to retain or store memory in at least two different selectable states. In a binary system, the states are considered as either a "0" or a "1". In other systems, at least some individual memory cells may be configured to store more than two levels or states of information.

Gated devices may be used in memory and other integrated circuitry. Example gated devices are field effect transistors (FETs), gated bipolar junction transistors (BJTs), and thyristors. The processing used in fabricating gated devices can be complex. Such complexities can be problematic in semiconductor fabrication processes in that they may increase costs, reduce throughput, and create risks of misalignment or other errors. Accordingly, it is desired to develop new methods of fabricating gated devices.

BRIEF DESCRIPTION OF THE DRAWINGS

FIGS. 3-12 are diagrammatic sequential isometric views of a substrate in process in accordance with some embodiments of the invention.

DETAILED DESCRIPTION OF EXAMPLE EMBODIMENTS

Embodiments of the invention encompass methods of forming an array of gated devices. Two example gated devices are shown in FIGS. 1 and 2, with FIG. 1 showing a gated transistor 10 and FIG. 2 showing a thyristor 20.

Figure 1:
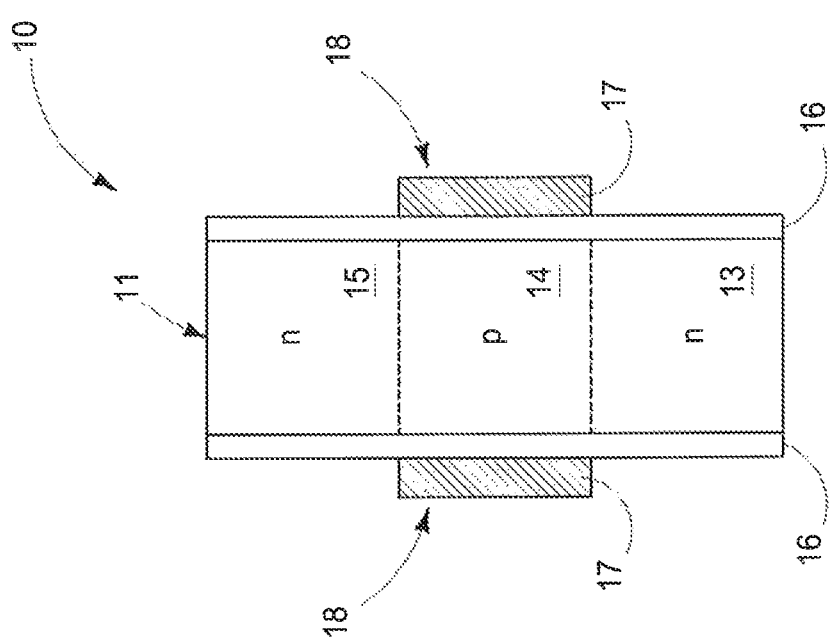
FIG. 1 is a diagrammatic vertical section view of a gated device that may be encompassed in embodiments of the invention.

Transistor 10 of FIG. 1 comprises semiconductor material 11 having three doped regions 13, 14, and 15 therein (dashed lines being used to show approximate interfaces of such regions). Any suitable semiconductive material may be used, with monocrystalline and/or polycrystalline silicon being examples. Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Region 13 comprises an elevationally inner region. Region 14 comprises a mid region elevationally outward of inner region 13. Region 15 comprises an elevationally outer region elevationally outward of mid region 14. In this document, "upper", "lower", "elevational", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Regions 13, 14, and 15 are shown as being n-type, p-type and n-type, respectively, such that device 10 is an NPN device. As an alternate example, the conductivity types of regions 13, 14, and 15 may be reversed such that the device is a PNP device. A gate dielectric 16 is along sidewalls of semiconductor material 11, and conductive (i.e., electrically) gate material 17 is over gate dielectric 16 operatively laterally proximate mid region 14. Gate material 17 forms or comprises part of access lines 18 that may extend into and out of the page relative to the cross-section of FIG. 1. Although there appears to be two separate access lines 18 on opposing sides of semiconductor material 11, in practice such access lines may be electrically coupled to one another in a location outside of the page so that they are part of a single continuous gate line. In the context of this document, devices or components are electrically coupled relative one another if in normal operation electric current is capable of continuously flowing from one to the other, and does so predominately by movement of subatomic positive and/or negative charges when such are sufficiently generated as opposed to predominately by movement of ions. Access lines 18 may extend only along two opposing sides of semiconductor material 11, or may wrap entirely around semiconductor material 11 for example where material 11 is in the shape of a pillar. As an alternate example, an access line 18 may be on only one side (not shown) of semiconductor material 11. Further, gate dielectric 16 is shown as extending elevationally outward and elevationally inward of access lines 18, although such is not required. As examples, transistor 10 may be a FET or a BJT.

Figure 2:
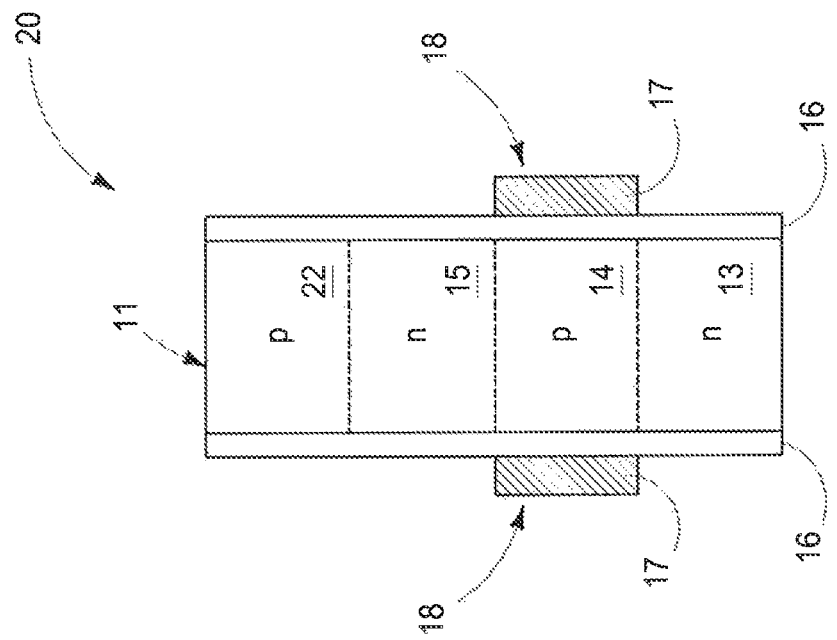
FIG. 2 is a diagrammatic vertical section view of a gated device that may be encompassed in embodiments of the invention.

In FIG. 2 with respect to thyristor 20, like numerals from FIG. 1 have been used where appropriate, with a construction difference being indicated with a different numeral. Thyristor 20 comprises semiconductor material 11 having four doped regions 13, 14, 15, and 22, with region 22 being elevationally outward of outer region 15. In the depicted embodiment, regions 13, 14, 15, and 22 are n-type, p-type, n-type, and p-type, respectively, such that device 20 is an NPNP device. As another example, such conductivity types may be reversed whereby the device is a PNPN device.

FIGS. 1 and 2 show but two example gated devices 10 and 20 that may be encompassed in embodiments of the invention. However, other gated devices, whether existing or yet-to-be-developed, may be used.

Figure 3:
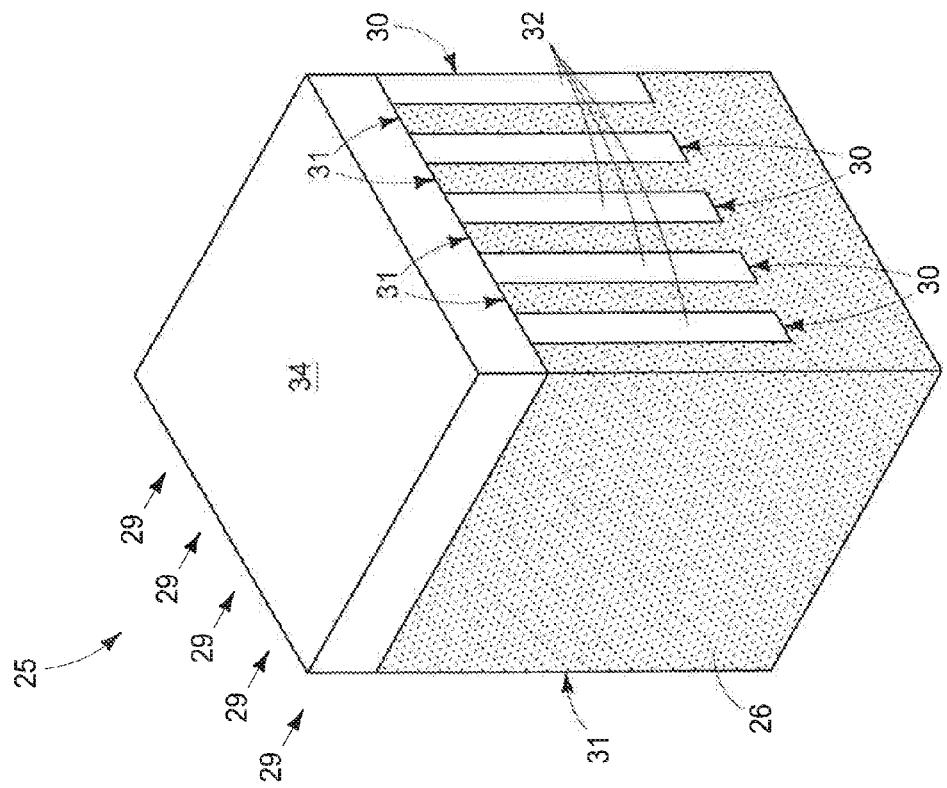

Example methods of forming an array of gated devices in accordance with embodiments of the invention are shown and described with reference to FIGS. 3-18. Like numerals from the above-described embodiments have been used where appropriate, with some construction differences being shown with letter suffixes or different numerals. A first-such embodiment is shown in FIGS. 3-12. FIG. 3 shows a fragment of a semiconductor substrate 25 comprising semiconductor material 26. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example semiconductor material 26 is doped or undoped monocrystalline and/or polycrystalline silicon.

Semiconductor material 26 has been removed elevationally inward (e.g., by anisotropic etching), thereby forming trenches 30 and walls 31. The array of gated devices being formed will be arranged in rows and columns, with walls 31 in the FIG. 3 example extending along columns 29. Use of "row" and "column" in this document is for convenience in distinguishing one series or orientation of lines from another series or orientation of lines and along which devices have been or will be formed. "Row" and "column" are used synonymously with respect to any series of devices, components, and/or features independent of function. Regardless, the rows may be straight and/or curved and/or parallel and/or not parallel relative one another, as may be the columns. Further, the rows and columns may intersect relative one another at 90° or at one or more other angles. Trenches 30 have been filled with dielectric material 32 (e.g., silicon dioxide and/or silicon nitride), followed by planarization back to expose semiconductor material 26. Such may be conducted, by way of example, by one or both of chemical mechanical polishing and etching. Masking material 34 (e.g., silicon dioxide and/or silicon nitride) has been formed elevationally over materials 26 and 32.

Figure 4:
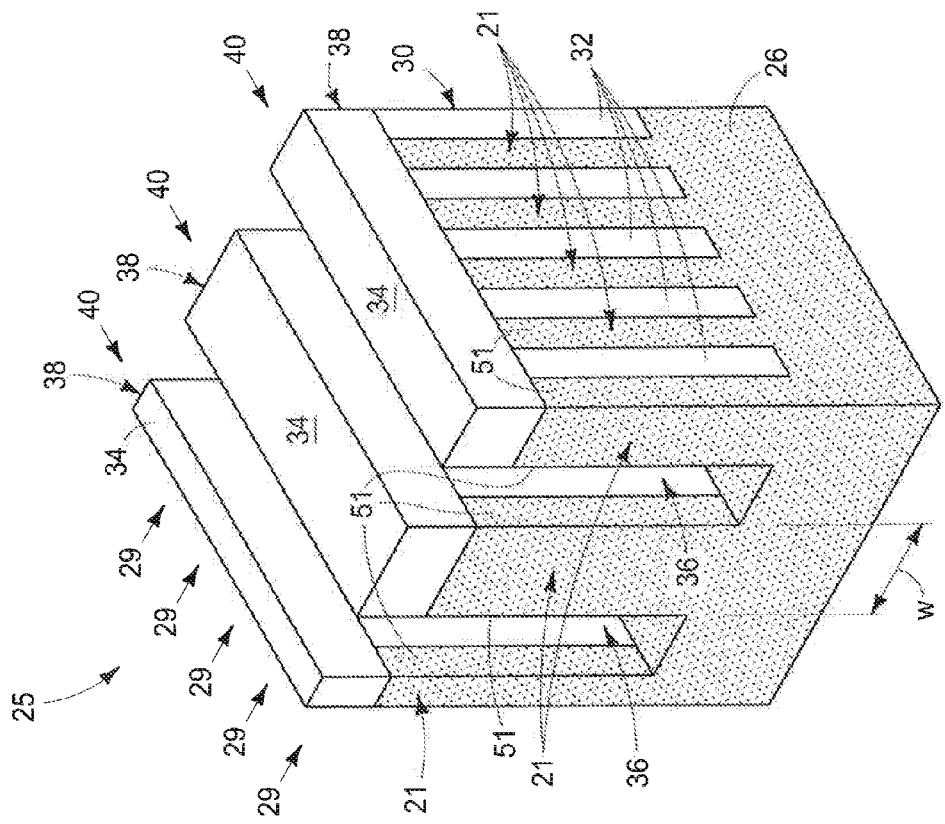

Referring to FIG. 4, masking material 34 has been patterned along rows 40 and used as a mask in anisotropically etching materials 26 and 32, thereby forming trenches 36 between walls 38 that longitudinally extend along rows 40. Semiconductor material-comprising blocks 21 have been formed thereby. Due to space constraints in the figures, only a single complete block 21 is shown centrally in the depicted left face of substrate 25 in FIG. 4, with different portions of two other blocks 21 being shown in the left face on each side of the central block 21. Accordingly, that single complete block structure 21 repeats in the individual rows. Blocks 21 may be considered individually as having two opposing sidewalls 51. In one embodiment, blocks 21 are formed to be individually laterally elongated orthogonal rows 40, for example along a dimension "W" as shown. In one embodiment, blocks 21 are formed to comprise space between immediately adjacent of the blocks in individual rows 40 which is filled with dielectric 32.

The above-described processing is but one example method of forming a plurality of semiconductor material-comprising blocks 21 individually projecting elevationally from a substrate and which are spaced from one another along rows and columns. Alternate existing or yet-to-be-developed techniques may be used.

Figure 5:
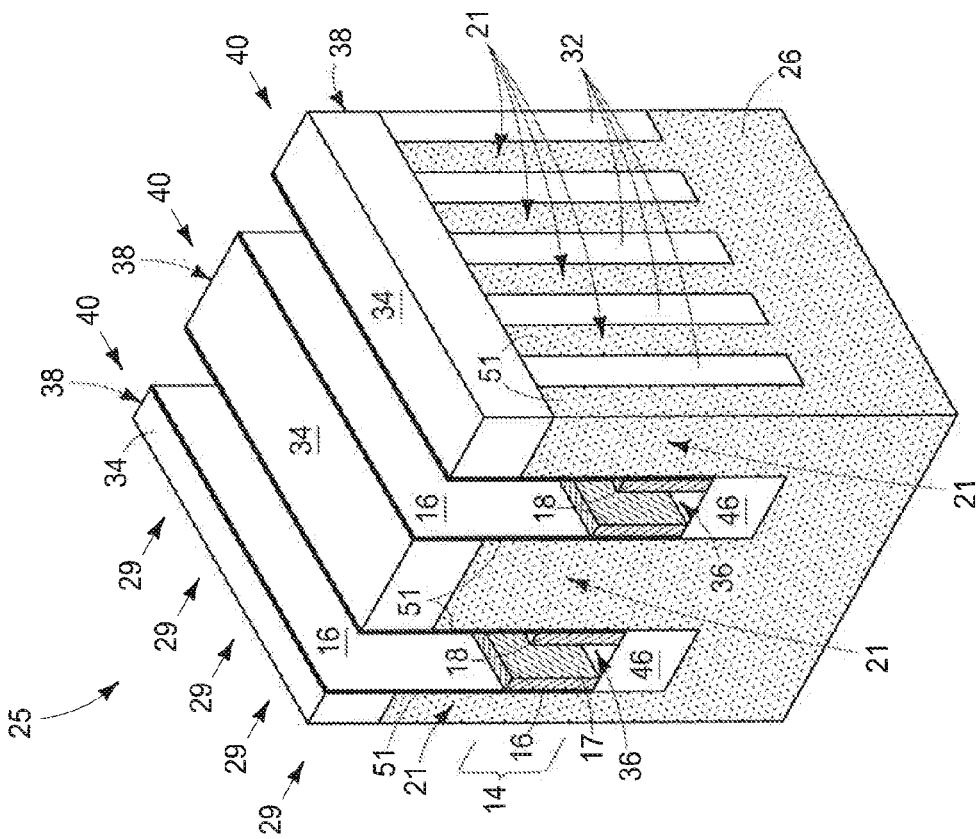

Referring to FIG. 5, a gate line 18 (e.g., an access line) has been formed laterally proximate each of two opposing sidewalls 51 of blocks 21 along individual rows 40. In one embodiment and as shown, gate lines 18 have been formed laterally over elevational mid regions 14 of blocks 21. Gate dielectric 16 is laterally between blocks 21 and material 17 of gate lines 18. Gate dielectric 16 in cross-section is shown as a solid dark line in FIG. 5+ for clarity. An example technique for forming the FIG. 5 construction includes deposition of a dielectric material 46 (e.g., silicon dioxide and/or silicon nitride) within trenches 36 at least to an elevational thickness sufficient to fill a bottom portion of such trenches. In this document, "thickness" by itself (no preceding directional adjective) is the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness. Dielectric material 46 has been removed back (e.g., by wet and/or dry etching) to its shown elevational thickness to expose sidewalls 51 of blocks 21. Gate dielectric 16 and material 17 of gate lines 18 may then be deposited in a conformal manner over walls 38. Then, anisotropic etching may be conducted to at least remove conductive gate material 17 from substantially being over horizontal surfaces and to be recessed elevationally inward as shown. Gate dielectric 16 may be removed from over horizontal surfaces (as shown) or may not be so removed (not shown). Gate dielectric 16 may also be elevationally recessed by anisotropic etching elevationally inward (not shown) to have uppermost surfaces that are largely elevationally coincident with material 17 of gate lines 18 (not shown).

After the gate lines have been formed, semiconductor material of the blocks is removed laterally between the gate lines to form pairs of pillars from the individual blocks that individually have one of the gate lines laterally proximate one of two laterally outmost sidewalls of the pair and another of the gate lines laterally proximate the other of the two laterally outmost sidewalls of the pair. One example of doing so is next described with reference to FIGS. 6-9.

Figure 6:
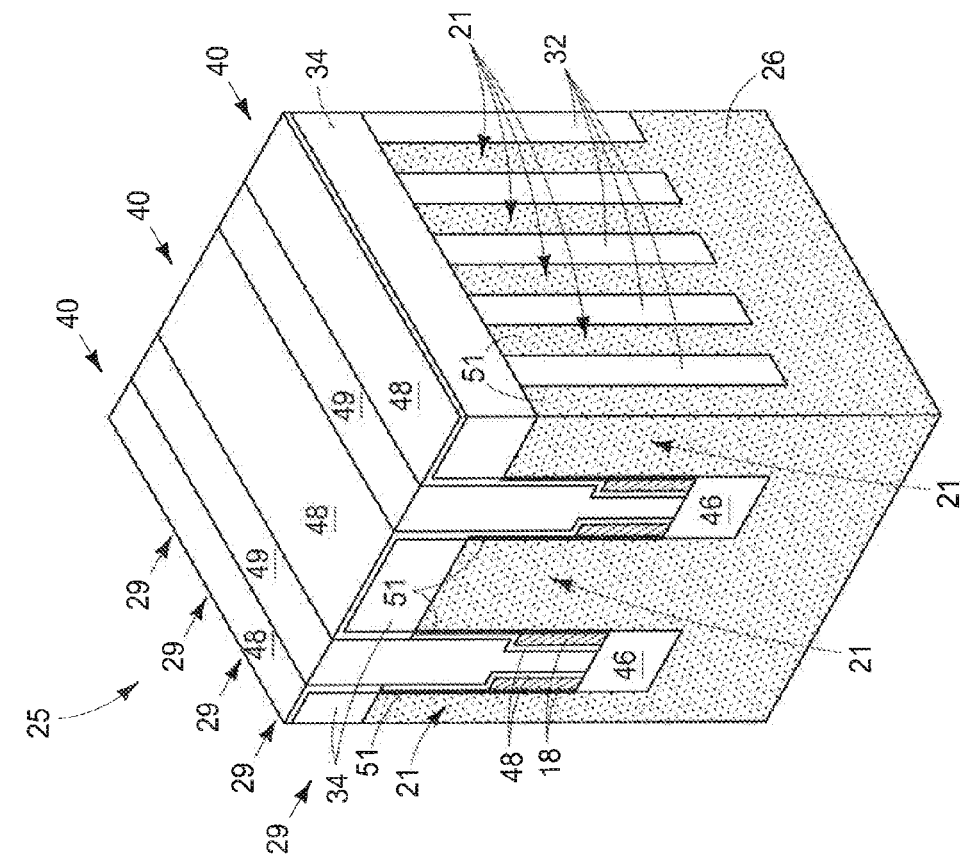

Referring to FIG. 6, dielectric material 48 (e.g., silicon nitride) and dielectric material 49 (e.g., silicon dioxide) have been deposited and planarized back.

Figure 7:
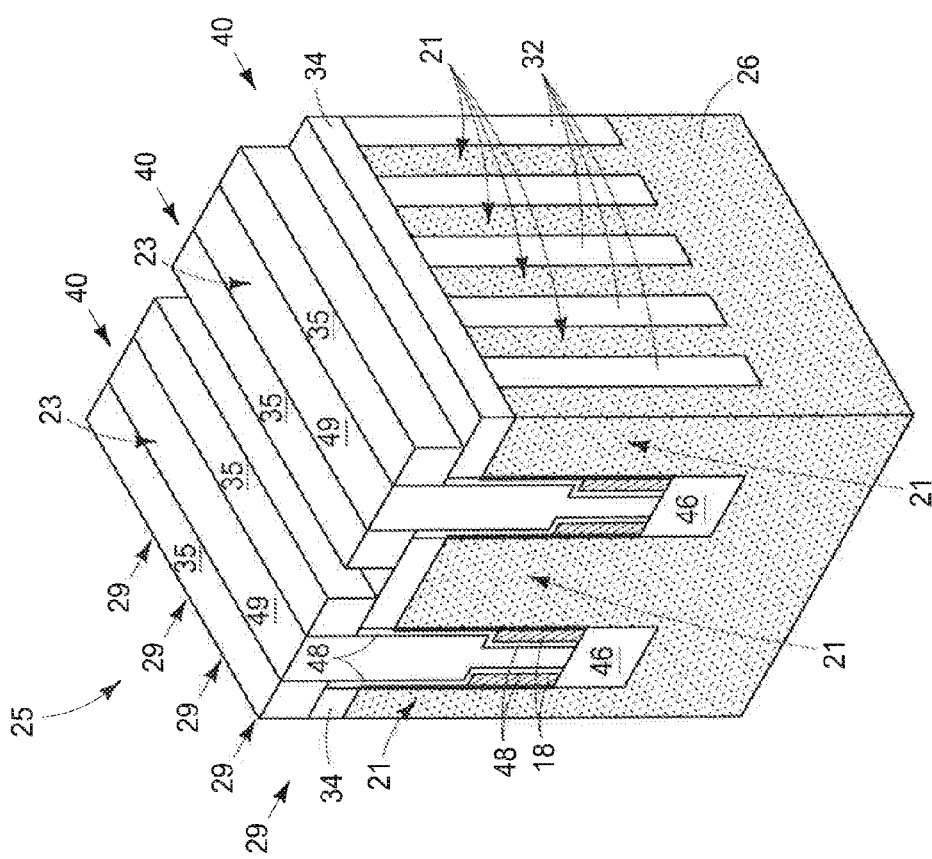

Referring to FIG. 7, an elevationally projecting feature 23 has been formed elevationally outward of and laterally between immediately adjacent blocks 21 along individual rows 40. An example technique for doing so includes provision of materials 34, 48, and 49 as shown in FIG. 6, followed by etching (e.g., dry or wet) material that is elevationally atop blocks 21 (e.g., materials 34 and 48) to reduce elevational thickness of such material. In one embodiment and as shown, the etching of materials 48 and 34 that are elevationally atop blocks 21 is conducted in the absence of any masking material being over material 49 from which projecting features 23 are formed at least within an array area of the substrate in which all of the gated devices are formed. Any alternate existing or yet-to-be-developed technique may be used to form features 23.

Figure 8:
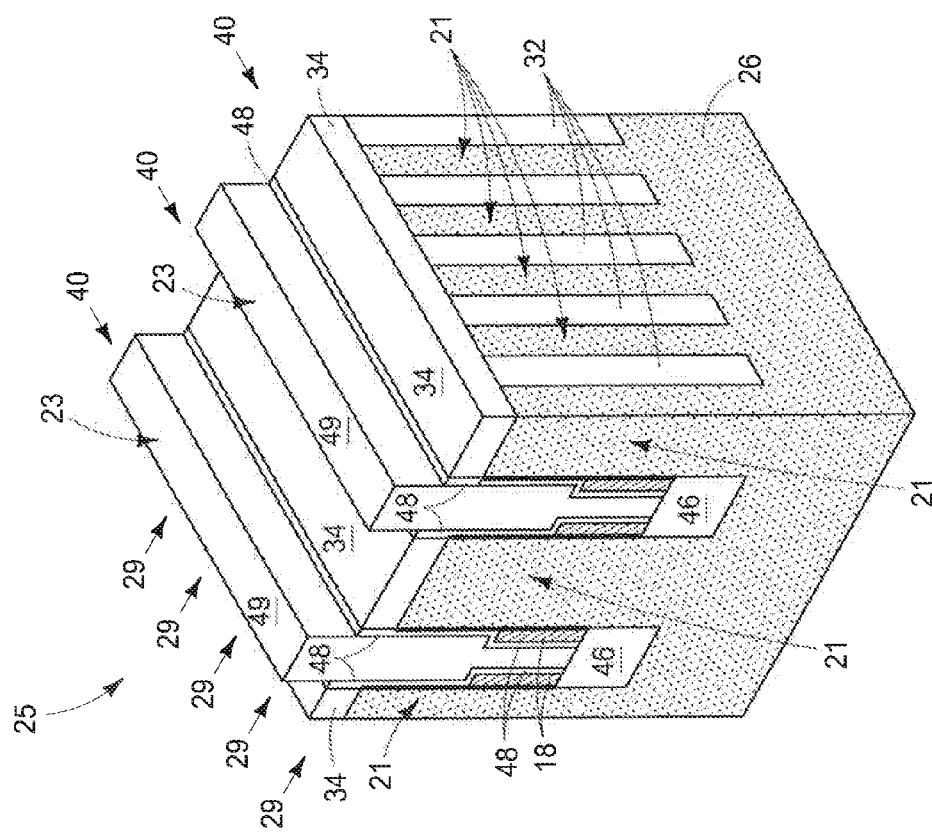

Referring to FIG. 8, spacers 35 have been formed on sidewalls of projecting features 23 elevationally over laterally outmost portions of blocks 21. In one embodiment, projecting features 23 and spacers 25 are of different composition relative one another (e.g., material 49 being silicon dioxide and material of spacers 35 being carbon). An example technique for forming spacers 35 is deposition of spacer material to an elevational thickness that is equal to about the depicted lateral thickness of spacers 35 over sidewalls of features 23. This can be followed by maskless (i.e., no mask being over at least the array area in which all the array of gated devices are being formed) etching of the spacer material to form the depicted spacers 35. Such etching may be conducted selectively relative to masking material 34 and selectively relative to material 49 when material 49 and the material of the spacers 35 are of different composition. In this document, a selective etch is an etch where one material is removed relative to another stated material at a rate of at least 1.5:1.

Referring to FIG. 9, projecting features 23 and spacers 35 have been used as a mask while etching semiconductor material 26 (e.g., anisotropically and selectively relative to dielectric material 32) to form pairs 55 of pillars 33a and 33b having void space 65 there-between. Again due to space constraints in the figures, only a single complete pair 55 is shown centrally in the depicted left face of substrate 25 in FIG. 9, with different portions of two other pairs 55 being shown in the left face on each side of the central pair 55. Accordingly, that single pair structure 55 repeats in the individual rows.

FIGS. 5-9 show but one example method of removing (e.g., by etching) semiconductor material 26 of blocks 21 laterally between gate lines 18 to form pairs 55 of pillars 33a, 33b from individual blocks 21. Other techniques may be used. Pairs 55 may be considered as individually having two laterally outermost sidewalls 51 and two laterally innermost sidewalls 53. Blocks 21 individually have one gate line 18 laterally proximate one of sidewalls 51 and another gate line 18 laterally proximate the other of sidewalls 51 of an individual pair 55. In one embodiment and as shown, the removing forms pillars 33a, 33b, in combination with gate lines 18, to be in mirror image in vertical cross-section (e.g., that of FIG. 9) in the individual pairs 55 (e.g., with gate lines 18 being on a respective one of laterally outermost sidewalls 51 of individual pairs 55.)

Referring to FIG. 10, spacers 35 (not shown) have been removed.

Figure 11:
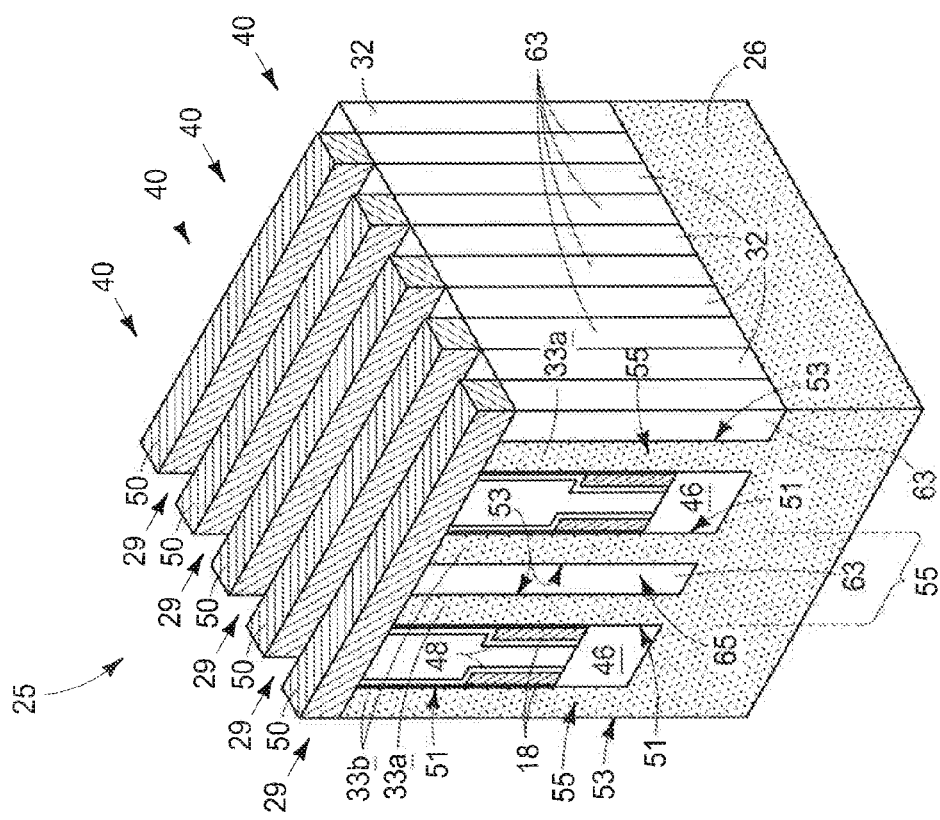

Referring to FIG. 11, dielectric material 63 (e.g., silicon dioxide and/or silicon nitride) has been deposited to fill void space 65 between pillars 33a and 33b in individual pairs 55. Then, materials 63, 48, 49, and 34 have been planarized back to expose semiconductor material 26 of pillars 33a and 33b. Elevationally outmost portions of pillars 33a and 33b may comprise outer region 15 of construction 10 in FIG. 1 or outer region 22 of construction 20 in FIG. 2, by way of examples. The doped regions of desired type(s) and concentration(s) for the gated devices (e.g., regions 13, 14, 15, and 22 of FIG. 1 or 2) may be formed at any suitable time and in any order, ideally some time after formation of pillars 33a, 33b or at least after formation of blocks 21, and are not specifically shown in the figures. In one embodiment, inner regions 13 of different gated devices are electrically coupled to one another (not shown). For example, a blanketing heavily-doped diffusion region (not shown) may be formed (e.g., by ion implantation) elevationally inward of and directly against the bottoms of pillars 33a, 33b, thereby being electrically coupled to inner regions 13. As an alternate example, conductive lines (not shown) may be formed elevationally inward of and directly against the bottoms of pillars 33a, 33b and be electrically coupled to one another proximate their respective ends.

Figure 12:
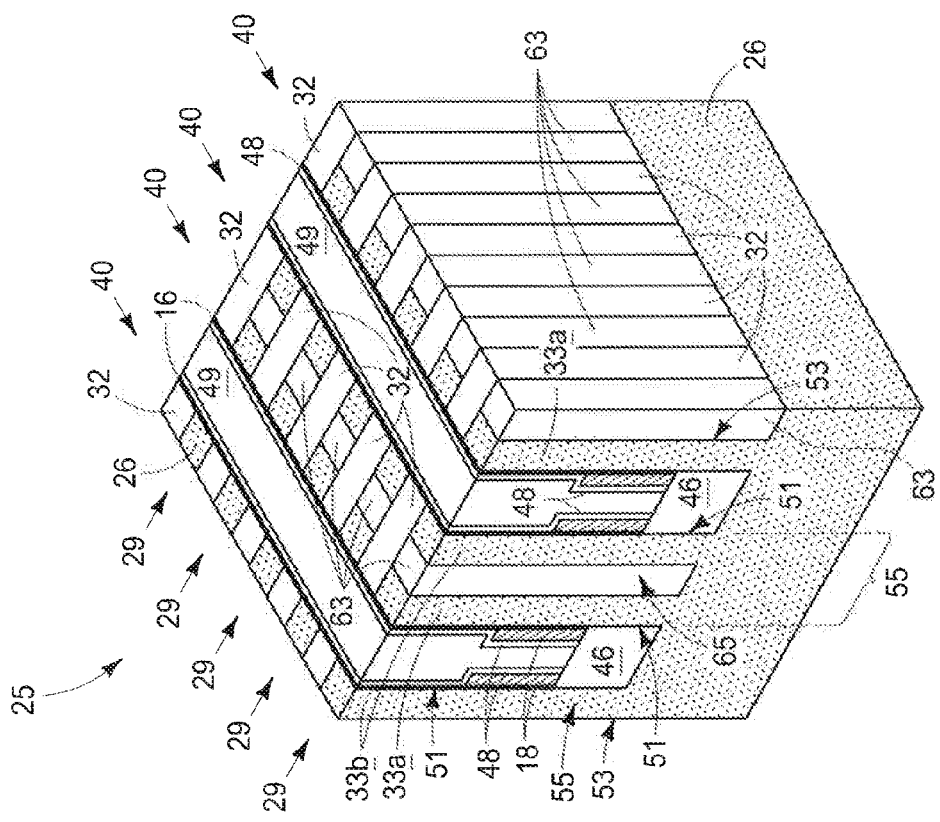

Referring to FIG. 12, a plurality of conductive data/sense lines 50 has been formed elevationally outward of and individually electrically coupled to outer regions of pillars 33a, 33b along individual columns 29.

In one embodiment, pillars 33a and 33b are formed to comprise three alternately doped, vertically superposed semiconductor material regions, and wherein the gated devices formed are transistors (e.g. a construction like that shown in FIG. 1). In one embodiment pillars 33a and 33b are formed to comprise four alternately doped, vertically superposed semiconductor material regions, and wherein the gated devices are thyristors (e.g., a construction like that shown in FIG. 2).

In one embodiment, no gate line is ever formed laterally proximate either of two laterally innermost sidewalls 53 of individual pairs 55. This could be beneficial to scale down size of individual gated devices and to reduce gate-to-pillar capacitive coupling without reducing gate dimensions, thus perhaps avoiding long gate etch times and possible subsequent gate height non-uniformity and/or non-integrity.

An embodiment of the invention includes a method using photolithography in forming an array of vertically oriented gated devices arranged in rows and individually comprising pillars (e.g., 33a, 33b) having only one row gate line (e.g., 18) operatively laterally proximate only one sidewall (e.g., 51 or 53) of two opposing sidewalls (e.g., 51, 53) of individual pillars. The two opposing sidewalls are formed at different times. Only one photolithographic step is used in forming the two opposing sidewalls. As an example, and by way of example only with respect to the above-described embodiments, the one sidewalls 51 in FIG. 4 may be formed using a photolithographic step. For example, an imageable material (e.g., photoresist or polyimide) may be deposited over material 34 and photolithographically patterned to have a mask outline corresponding to walls 38 in FIG. 4 atop material 34. Accordingly, that photolithographic step and mask produced thereby could be used at least in part in forming sidewalls 51 of pillars 33a, 33b. In one embodiment, a mask comprising sidewall spacers (e.g., spacers 35 in FIGS. 8 and 9) may be used in forming the other sidewalls 53 of two sidewalls 51, 53 of pillars 33a, 33b. In one embodiment, the photolithographic step is used in forming the one sidewalls of the pillars. In one embodiment, the one sidewalls of the pillars are formed before forming the other of the two sidewalls of the pillars.

Figure 13:
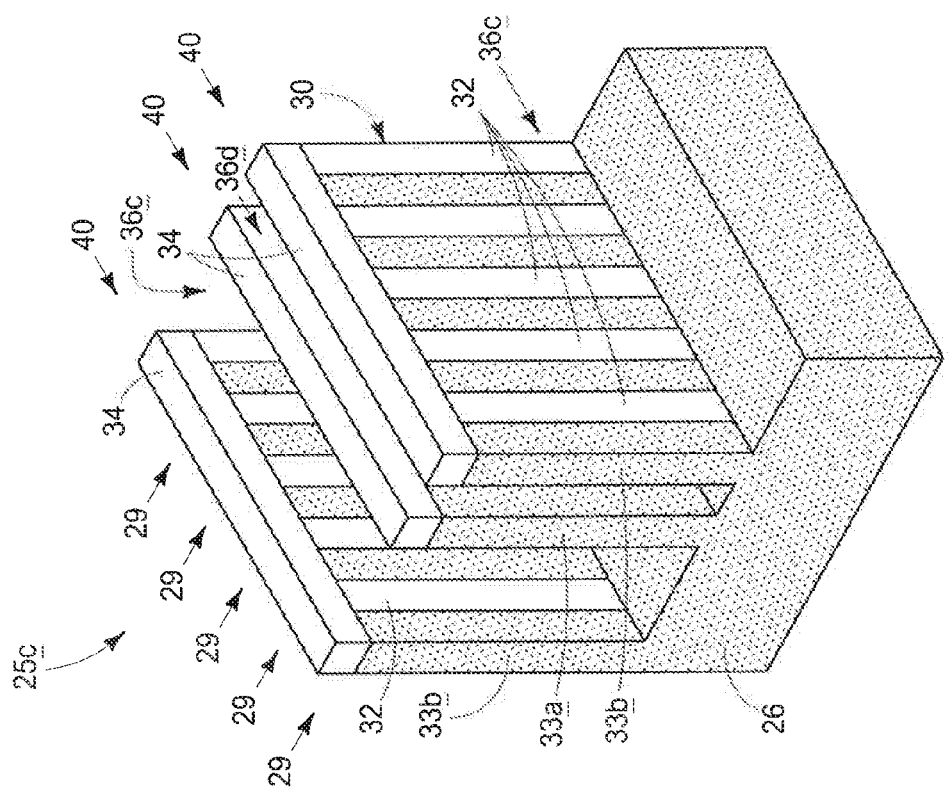

Another example embodiment of forming an array of gated devices in accordance with the invention is described with reference to FIGS. 13-18 with respect to a substrate fragment 25c. Like numerals from the above-described embodiments have been used where appropriate, with some construction differences being indicated with the suffix "c" or "d" or with different numerals. Referring to FIG. 13, a plurality of semiconductor material-comprising pillars 33a, 33b has been formed which individually project elevationally from a substrate and are spaced from one another along rows 40 and columns 29. Immediately adjacent of rows 40 are spaced from one another by alternating wider spaces 36c and narrower spaces 36d. Again due to space constraints in the figures, only a single narrower space 36d is shown in FIG. 9. Accordingly, the alternating relationship of spaces 36c and 36d repeats along the column direction (e.g., orthogonal the rows). In one embodiment and as shown, pillars 33a, 33b are formed to comprise void space between immediately adjacent of the pillars in individual rows 40 that is filled with solid dielectric material 32.

Figure 14:
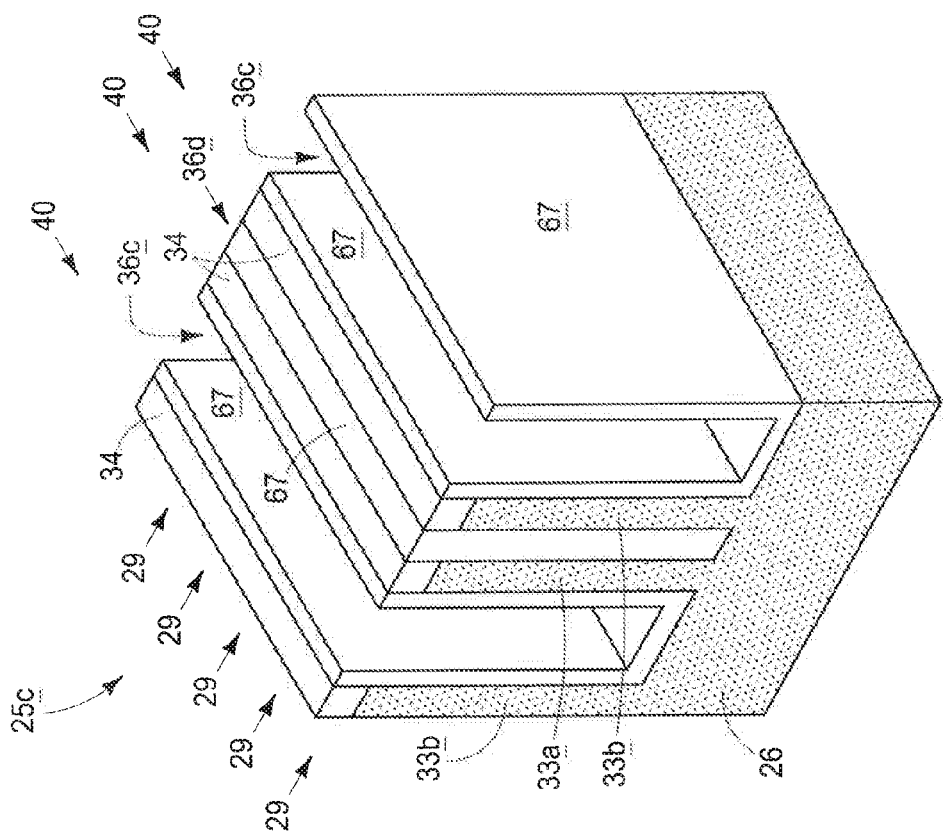
FIGS. 13-18 are diagrammatic sequential isometric views of a substrate in process in accordance with some embodiments of the invention.

Referring to FIG. 14, a fill material 67 (e.g., silicon dioxide and/or silicon nitride) has been deposited to a thickness that fills narrower spaces 36d and that lines sidewalls and bases of wider spaces 36c to less-than-fill wider spaces 36c.

Figure 15:
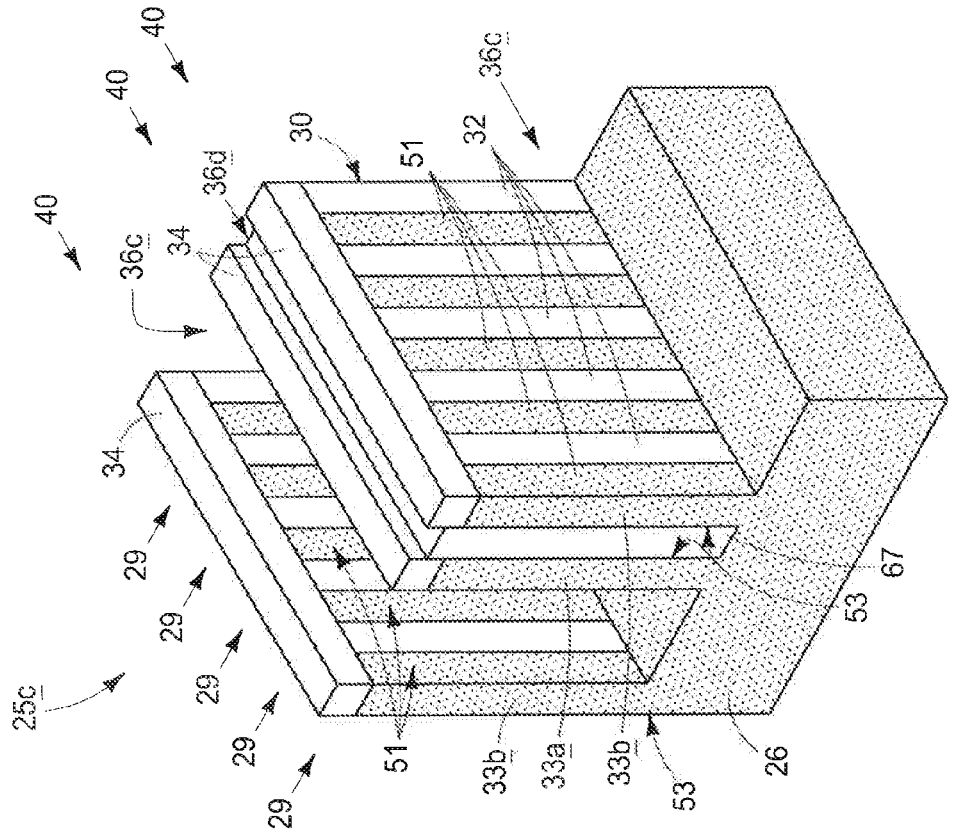

Referring to FIG. 15, fill material 67 has been removed from being over sidewalls of an elevational mid region of individual pillars 33a, 33b in wider spaces 36a while leaving fill material 67 over sidewalls of the elevational mid region of individual pillars 33a, 33b in narrower spaces 36d. In one embodiment and as shown, the removing removes all of fill material 67 from wider spaces 36c, and in one embodiment removes some of fill material 67 from narrower spaces 36d. An example technique for doing so includes wet or dry isotropic etching timed to just remove the thickness of fill material 67 which lines wider spaces 36c, thereby also removing about that same elevational thickness of fill material 67 in narrower spaces 36d, as shown.

Figure 16:
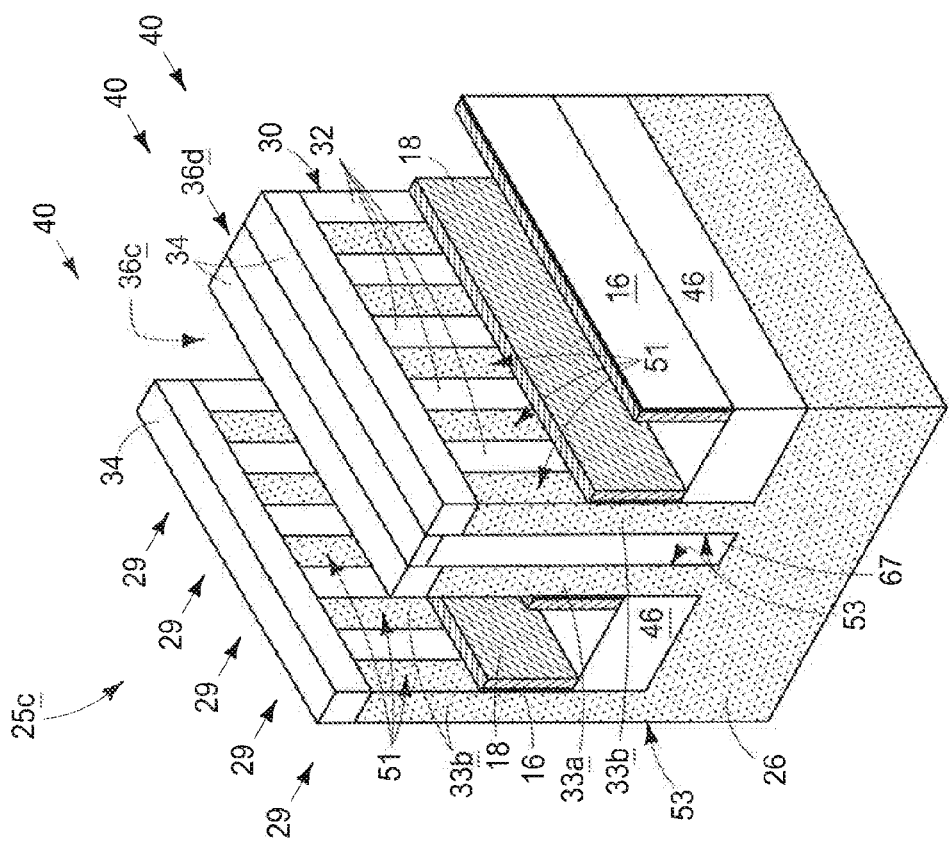

Referring to FIG. 16, and after the removing of fill material 67 and while fill material 67 is over sidewalls of the elevational mid regions of the pillars in narrower spaces 36d, a gate line 18 has been formed laterally proximate sidewalls 51 of elevational mid regions of pillars 33a, 33b in wider spaces 36c but not in narrower spaces 36d. Processing to produce the construction of FIG. 16 may occur analogously to that described above with respect to FIG. 5.

Figure 18:
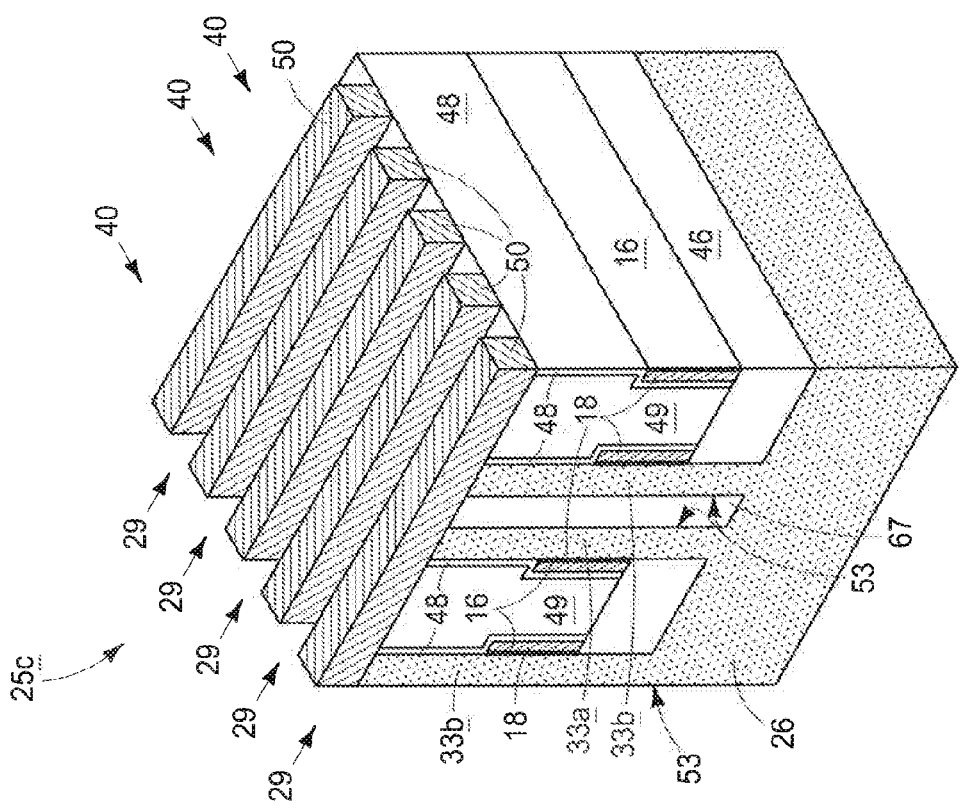
Figure 17:
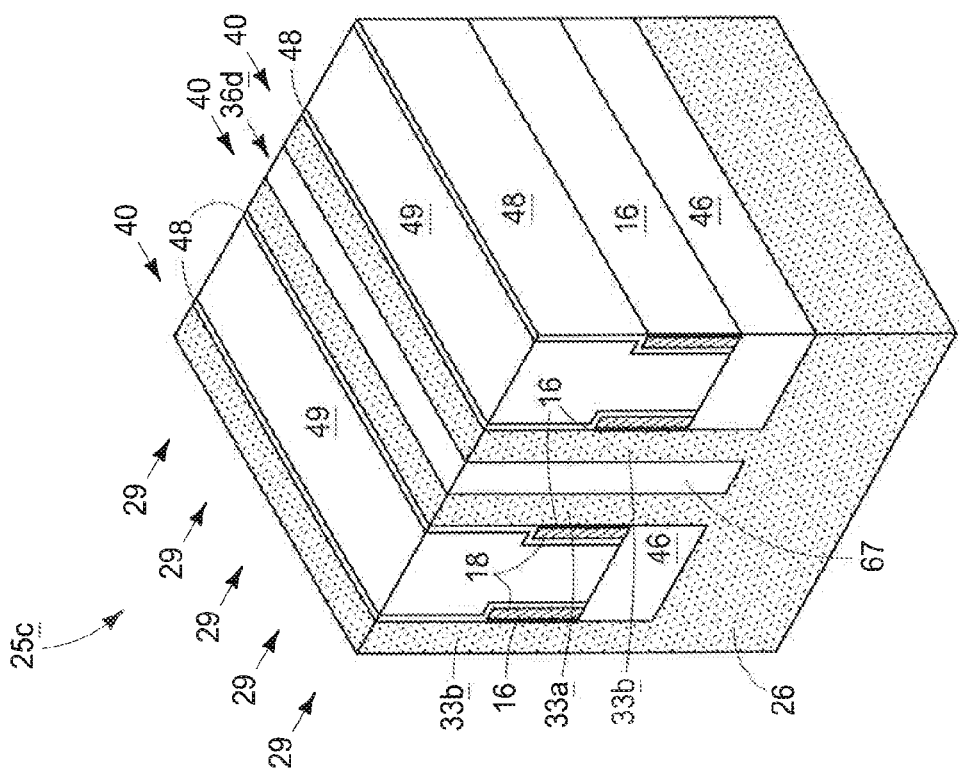

FIGS. 17 and 18 show subsequent processing analogous to that described above with respect to FIGS. 6, 11, and 12 whereby data/sense lines 50 are formed. In one embodiment, no gate line is ever formed laterally proximate sidewalls 53 of the elevational mid region of individual pillars 33c, 33d in narrower spaces 36d.

Other attribute(s) or construction(s) as described above may be used.

CONCLUSION

In some embodiments, a method of forming an array of gated devices comprises forming a plurality of semiconductor material-comprising blocks individually projecting elevationally from a substrate and spaced from one another along rows and columns. A gate line is formed laterally proximate each of two opposing sidewalls of the blocks along individual rows of the blocks. After forming the gate lines, semiconductor material of the blocks is removed laterally between the gate lines to form pairs of pillars from the individual blocks that individually have one of the gate lines laterally proximate one of two laterally outermost sidewalls of the pair and another of the gate lines laterally proximate the other of the two laterally outermost sidewalls of the pair.

In some embodiments, a method uses photolithography in forming an array of vertically oriented gated devices arranged in rows and individually comprising pillars having only one row gate line operatively laterally proximate only one of two opposing sidewalls of the individual pillars. The two opposing sidewalls are formed at different times. Only one photolithographic step is used in forming the two opposing sidewalls.

In some embodiments, a method of forming an array of gated devices comprises forming a plurality of semiconductor material-comprising pillars individually projecting elevationally from a substrate and spaced from one another along rows and columns. Immediately adjacent of the rows are spaced from one another by alternating wider spaces and narrower spaces. A fill material is deposited to a thickness that fills the narrower spaces and that lines sidewalls and bases of the wider spaces to less-than-fill the wider spaces. The fill material is removed from being over the sidewalls of an elevational mid region of the individual pillars in the wider spaces while leaving the fill material over sidewalls of the elevational mid region of the individual pillars in the narrower spaces. After the removing and while the fill material is over the sidewalls of the elevational mid region of the pillars in the narrower spaces, a gate line is formed laterally proximate the sidewalls of the elevational mid region of the pillars in the wider spaces but not in the narrower spaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of gated devices, comprising:
   forming a plurality of semiconductor material-comprising blocks individually projecting elevationally from a substrate and spaced from one another along rows and columns;
   forming a gate line laterally proximate each of two opposing sidewalls of the blocks along individual rows of the blocks; and
   after forming the gate lines, removing semiconductor material of the blocks laterally between the gate lines to form pairs of pillars from the individual blocks that individually have one of the gate lines laterally proximate one of two laterally outermost sidewalls of the pair and another of the gate lines laterally proximate the other of the two laterally outermost sidewalls of the pair.

2. The method of claim 1 wherein the forming of the gate line laterally proximate each of the two opposing sidewalls of the blocks forms the gate lines laterally over elevational mid regions of the blocks.

3. The method of claim 1 comprising forming the blocks to be individually laterally elongated orthogonal the rows.

4. The method of claim 1 wherein no gate line is ever formed laterally proximate either of two laterally innermost sidewalls of the pair.

5. The method of claim 1 wherein the removing forms the pillars in combination with the gate lines to be in mirror image in vertical cross-section in individual of the pairs.

6. The method of claim 1 wherein the removing forms void space between the pillars in individual of the pairs, and further comprising filling the void space with dielectric material.

7. The method of claim 1 wherein the removing comprises etching of the semiconductor material, and comprising:
   forming an elevationally projecting feature elevationally outward of and laterally between immediately adjacent of the blocks along the individual rows of the blocks;
   forming spacers on sidewalls of the projecting features elevationally over laterally outermost portions of the blocks; and
   using the projecting features and the spacers as a mask while etching the semiconductor material.

8. The method of claim 7 wherein the projecting features and spacers are of different composition relative one another.

9. The method of claim 7 wherein forming the projecting features comprises etching material that is elevationally atop the blocks to reduce its elevational thickness.

10. The method of claim 9 wherein the etching of the material that is elevationally atop the blocks is conducted in the absence of any masking material being over material from which the projecting features are formed at least within an array area of the substrate in which all of the gated devices are formed.

11. The method of claim 7 wherein the etching forms the pillars in combination with the gate lines to be in mirror image in vertical cross-section in individual of the pairs.

12. The method of claim 1 wherein the pillars are formed to comprise three alternately doped, vertically superposed semiconductor material regions, and wherein the gated devices are transistors.

13. The method of claim 1 wherein the pillars are formed to comprise four alternately doped, vertically superposed semiconductor material regions, and wherein the gated devices are thyristors.

14. A method using photolithography in forming an array of vertically oriented gated devices arranged in rows and individually comprising pillars having only one row gate line operatively laterally proximate only one of two opposing sidewalls of the individual pillars, the two opposing sidewalls being formed at different times, the method comprising using only one photolithographic step in forming the two opposing sidewalls.

15. The method of claim 14 comprising using a mask comprising sidewall spacers in forming the other of the two sidewalls of the pillars.

16. The method of claim 14 wherein the photolithographic step is used in forming the one sidewalls of the pillars.

17. The method of claim 16 wherein the one sidewalls of the pillars are formed before forming the other of the two sidewalls of the pillars.

18. The method of claim 17 comprising using a mask comprising sidewall spacers in forming the other of the two sidewalls of the pillars.

19. A method of forming an array of gated devices, comprising:
    forming a plurality of semiconductor material-comprising pillars individually projecting elevationally from a substrate and spaced from one another along rows and columns, immediately adjacent of the rows being spaced from one another by alternating wider spaces and narrower spaces;
    depositing a fill material to a thickness that fills the narrower spaces and that lines sidewalls and bases of the wider spaces to less-than-fill the wider spaces;
    removing the fill material from being over the sidewalls of an elevational mid region of the individual pillars in the wider spaces while leaving the fill material over sidewalls of the elevational mid region of the individual pillars in the narrower spaces; and
    after the removing and while the fill material is over the sidewalls of the elevational mid region of the pillars in the narrower spaces, forming a gate line laterally proximate the sidewalls of the elevational mid region of the pillars in the wider spaces but not in the narrower spaces.

20. The method of claim 19 wherein the pillars are formed to comprise space between immediately adjacent of the pillars in the individual rows which is filled with solid dielectric material before and during the depositing.

21. The method of claim 19 wherein the fill material is dielectric.

22. The method of claim 19 wherein the removing removes all of the fill material from the wider spaces.

23. The method of claim 19 wherein the removing removes some of the fill material from the narrower spaces.

24. The method of claim 23 wherein the removing removes all of the fill material from the wider spaces.

25. The method of claim 19 wherein no gate line is ever formed laterally proximate the sidewalls of the elevational mid region of the individual pillars in the narrower spaces.

* * * * *